United States Patent
Visser

(10) Patent No.: US 8,958,761 B2
(45) Date of Patent: Feb. 17, 2015

(54) DETERMINING ON CHIP LOADING IMPEDANCE OF RF CIRCUIT

(75) Inventor: Hendrik A. Visser, Wijchen (NL)

(73) Assignee: NXP, B.V., Eindhoven (NL)

( * ) Notice: Subject to any disclaimer, the term of this patent is extended or adjusted under 35 U.S.C. 154(b) by 1026 days.

(21) Appl. No.: 12/446,678

(22) PCT Filed: Oct. 18, 2007

(86) PCT No.: PCT/IB2007/054249
§ 371 (c)(1),
(2), (4) Date: Apr. 22, 2009

(87) PCT Pub. No.: WO2008/050268
PCT Pub. Date: May 2, 2008

(65) Prior Publication Data
US 2010/0029226 A1    Feb. 4, 2010

(30) Foreign Application Priority Data
Oct. 25, 2006    (EP) .................................... 06122917

(51) Int. Cl.
| | |
|---|---|
| *H03C 1/62* | (2006.01) |
| *H03H 7/40* | (2006.01) |
| *H03F 1/02* | (2006.01) |
| *H03F 1/32* | (2006.01) |
| *H03F 1/56* | (2006.01) |
| *H03F 3/191* | (2006.01) |
| *H03F 3/24* | (2006.01) |

(52) U.S. Cl.
CPC .............. *H03H 7/40* (2013.01); *H03F 1/0205* (2013.01); *H03F 1/32* (2013.01); *H03F 1/56* (2013.01); *H03F 3/191* (2013.01); *H03F 3/24* (2013.01); *H03F 2200/378* (2013.01); *H03F 2200/387* (2013.01); *H03F 2200/391* (2013.01)
USPC ...................................................... 455/115.1

(58) Field of Classification Search
USPC .................... 455/115.1, 115.3, 120, 124, 126
See application file for complete search history.

(56) References Cited

U.S. PATENT DOCUMENTS

| | | | | |
|---|---|---|---|---|
| 5,673,001 | A * | 9/1997 | Kim et al. ...................... | 330/284 |
| 6,429,685 | B1 | 8/2002 | Stockstad | |
| 6,788,145 | B2 * | 9/2004 | Tegeler et al. ................. | 330/254 |
| 7,076,009 | B2 * | 7/2006 | Wieck ............................ | 375/345 |
| 7,155,242 | B1 * | 12/2006 | MacKenzie et al. .......... | 455/466 |

(Continued)

FOREIGN PATENT DOCUMENTS

| | | |
|---|---|---|
| EP | 1413891 A1 | 4/2004 |
| EP | 1515449 A | 3/2005 |

OTHER PUBLICATIONS

Kantorovich, Issac, et al; "In-Situ-Measurement of Impedance of Die Power Delivery System"; IEEE 2004; p. 229-232.

(Continued)

*Primary Examiner* — Sibin Chen

(57) ABSTRACT

An R.F. transmitter circuit has an amplifier (30), a matching network (40) coupled to an output of the amplifier, a programmable resistance (35) coupled to the output of the amplifier, and a controller (60) arranged to control the programmable resistance, and to determine a matched output impedance of the amplifier by detecting a change in the amplifier output for different values of the programmable resistance. This output impedance can be used to adjust the matching to achieve optimum gain or optimum efficiency or other characteristic, during manufacture, test, or in use.

18 Claims, 7 Drawing Sheets

(56) References Cited

U.S. PATENT DOCUMENTS

| | | | |
|---|---|---|---|
| 7,173,466 B2 * | 2/2007 | Chiba et al. | 327/231 |
| 7,640,040 B2 * | 12/2009 | Poilasne et al. | 455/562.1 |
| 2002/0089351 A1 | 7/2002 | Stockstad | |
| 2002/0131523 A1 * | 9/2002 | Nagasaka et al. | 375/297 |
| 2003/0102932 A1 | 6/2003 | Lee et al. | |
| 2003/0116810 A1 | 6/2003 | Kim et al. | |
| 2004/0251984 A1 | 12/2004 | Javor | |
| 2005/0046749 A1 | 3/2005 | Yamamoto | |

OTHER PUBLICATIONS

Koo, Kyoung-Hoi; "Digitally Tuneable On-Chip Resistor in CMOS for High-Speed Data Transmission"; IEEE 2003; p. I-185-I-188.

* cited by examiner

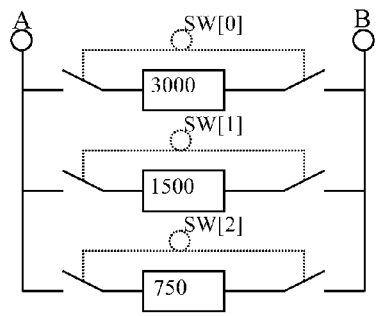 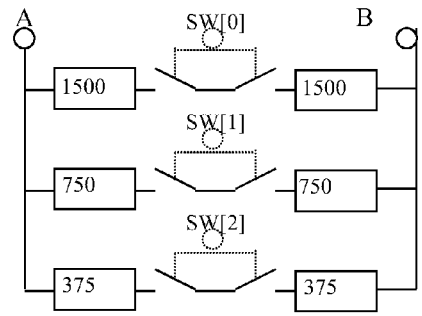
FIG 9a  FIG 9b
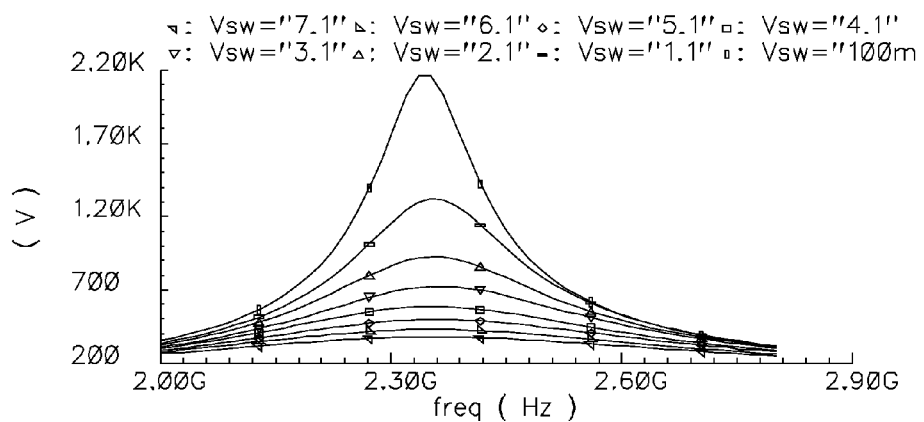
FIG 10

DETERMINING ON CHIP LOADING IMPEDANCE OF RF CIRCUIT

FIELD OF THE INVENTION

This invention relates to device and circuits such as integrated semiconductor devices arranged to determine a load impedance of a circuit, e.g. an on-chip load impedance and to corresponding methods.

DESCRIPTION OF THE RELATED ART

It is known to provide on-chip termination for driver circuits for high speed data transmission applications by adding a matching resistor in parallel with the load on the output of the driver. US patent application 20030116810 explains that it would be desirable to provide an adjustable resistance using an off-chip device having selectable resistance, which can be selected by a digital signal periodically updated according to changes in conditions such as voltage and temperature. This document proposes a programmable impedance control circuit for use with an external resistor and having a voltage divider coupled to the external resistor and other components to generate various impedance values.

U.S. Pat. No. 6,429,685 shows measuring an output impedance of a driver circuit, and using a partially active circuit to set the output impedance, to achieve a linear output characteristic. However this arrangement dissipates DC current.

It is also known to determine a low-ohmic resistor of a supply line by using two on-chip states of dissipation (of a digital circuit). It is also known to provide a transmitter on a transceiver chip. The output of the transmitter typically goes through a SAW filter. The SAW filter is known to have a specified filter characteristic only if it is terminated with the correct source and load impedances. The transmitter requires an optimum load impedance to deliver the maximum linear output power. It is also known that the optimum load impedance for the transmitter is not the same as the transmitter output impedance.

The SAW filter impedance is typically transformed with some external matching tracks, external components, which combine with effects of the package and of the bond-wires, to create a new on-chip load impedance. This load impedance should be not too low, because the transmitter output is close to a current source, and the power is given by the current out squared and then multiplied with the load impedance. More output power is obtained by having a higher load impedance. But having a too high load, will cause large voltage swings across the load, and at a certain point, the output transistor (current source) will saturate and clip. This will cause distortion. There will be an optimum load impedance, to enable the highest output power with a good linearity. The matching elements should be selected or tuned to reach the optimum on chip load impedance seen by the output of the transmitter.

But the optimum source impedance seen by the input of the SAW filter is typically affected by such selecting or tuning of the matching elements. The source impedance comes from the transmitter, with is typically an open collector structure, and thus is high impedance, only limited by losses. This impedance gets transformed to the output into a new open collector impedance. This impedance will not be the impedance that the SAW filter wants to see. Thus the SAW performance is degraded, showing for example an in-band ripple, and worse suppression of out-of-band signal components.

In other words, transforming the SAW filter load to the optimum transmitter load, means that at the same time the transmitter impedance is transformed to a non-optimum SAW source impedance. It is known to add a resistive loss at the transmitter output (open collector), that will lower the open collector impedance, in such a way that also the SAW source impedance is suitable. It is nevertheless difficult to determine what value the resistance should have as it is hard to measure the impedance effects of external matching tracks, external components, the package and of the bond-wires and so on, on RF signals.

SUMMARY OF THE INVENTION

An object of the invention is to provide improved device and circuits such as integrated semiconductor devices arranged to determine a load impedance of a circuit, e.g. an on-chip load impedance and corresponding methods.

According to a first aspect, the invention provides:

An R.F. circuit having an amplifier, a matching network coupled to an output of the amplifier, a programmable resistance coupled to the output of the amplifier, and a controller arranged to control the programmable resistance, and to determine a matched output impedance of the amplifier by detecting a change in the amplifier output for different values of the programmable resistance.

By determining the matched output impedance, the performance of the amplifier or of downstream circuits such as filters, can be improved or monitored. The amplifier output can be detected directly at the output of the amplifier, or downstream after a matching network or further downstream.

Another aspect of the invention provides a method of operating a circuit having an amplifier, a matching network coupled to an output of the amplifier, and a programmable resistance coupled to the output of the amplifier, the method comprising: controlling the programmable resistance, and determining a matched output impedance of the amplifier by detecting a change in the amplifier output for different values of the programmable resistance.

Any additional features disclosed with respect to this invention can be added to these aspects, and some such additional features are described below. Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

BRIEF DESCRIPTION OF THE DRAWINGS

How the present invention may be put into effect will now be described by way of example with reference to the appended drawings, in which:

FIGS. 9a and 9b shows examples of a programmable resistance network, FIGS. 10 and 11 show results of measuring the output load termination.

DESCRIPTION OF THE PREFERRED EMBODIMENTS

Figure 1:
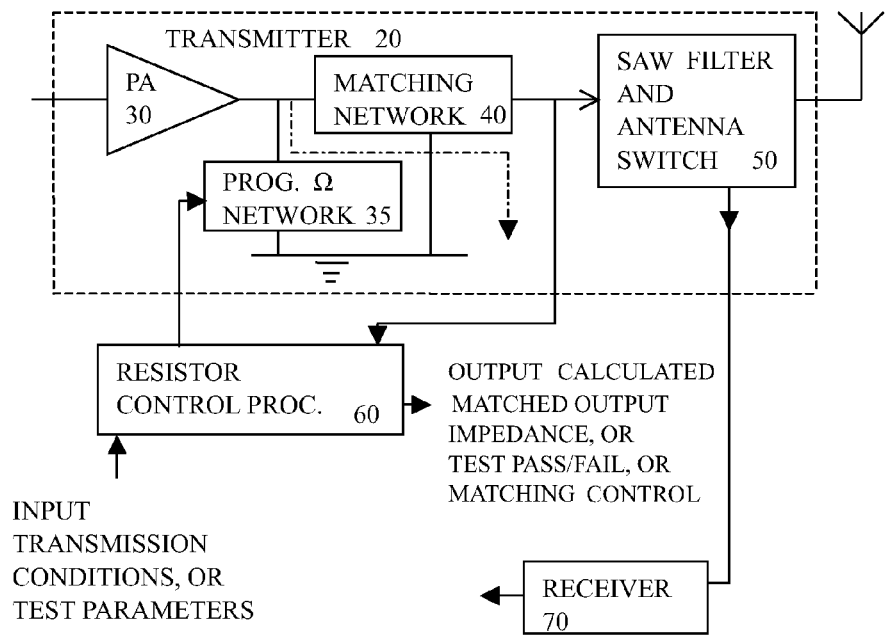
FIG. 1 shows a schematic view of an embodiment of the invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

The term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

The embodiments described show a resistive switch for use in an RF front end. The switch may be integrated within an IC (Qubic or RFCMOS), or in other types of device. At RF frequencies the parasitics make it harder to predict what load impedance is found on chip, and so measuring load impedance becomes more important. RF is regarded here as meaning above about 500 MHz.

As is known, impedance matching is needed between a power amplifier (PA) and an antenna (before or after an antenna switch) in order to provide a transformation of the impedance to a useful value, e.g. to a standard 50-ohm's interface. Generally this is achieved before a passband filter.

The embodiments are concerned with the problem that the impedance transformation provides a proper transformation for the power amplifier (PA), but not a proper value for the passband filter. The perfect value for the passband filter would be achieved if the PA's load (or output) impedance were equal to the filter's source (or input) impedance. However, the chance of this is very small, particularly with the open collector (or open drain) structure conventionally used in power amplifiers.

The consequence and the real problem, is that a substantial part of the output power is lost in the case of an impedance transformation that is perfect for the power amplifier. The embodiments use a programmable resistance, e.g. in the form of a resistive switch or a programmable resistive switch network, or an active circuit arranged to provide a programmable resistance. At least for applications where power and linearity are a main concern, a resistor is by far the easier to implement without sacrificing linearity or power, as there is no power sacrifice when switched off. The switch (or switch network) can be arranged to couple the line between amplifier and filter to ground for the case that the switch is closed. The driving of the switch or switch network can be carried out by any type of control circuitry as desired to suit the application. The control circuitry is able to program the resistance the switch or switch network. In the embodiments illustrated, which are only examples, the switch or switch network is driven by a digital inverter or buffer that is programmed via a digital register. The register can be controlled by a digital baseband processor integrated circuit having on board ROM. It can use a standard interface such as a Universal Serial Bus, USB.

The same or other control circuitry can be used to receive a signal representing the output of the power amplifier after the matching network, and to control the switch or switch network, to alter the resistance and record the consequential change in output of the power amplifier. As will be explained below in more detail, this control circuitry, or other processor circuitry remote from the PA can then use the values of resistance, and the corresponding matched output measurement values, to determine a value for the equivalent matched output impedance of the PA. Following this resistive switching to determine the matched output impedance value, this value can be used in various ways, one of which is to adjust the matching to obtain the optimal impedance transformation to achieve a desired characteristic, such as optimum gain or optimum efficiency or other characteristic as desired. A power detector can measure power values as well.

In other words, at least some of the embodiments involve adding a resistive loss at the transmitter output (e.g. open collector), that will lower the output impedance, e.g. open collector impedance, in such a way that now also the filter impedance, e.g. the SAW source impedance, is correct. A drawback is that output power is lost in that additional resistor. Therefore this resistor was implemented not as a fixed value resistor, but as a programmable resistance having for example a number of values such as 50 Ohms, depending on Rsource of SAW (which can be 100 Ohms or 150 Ohms, or other values, depending on brand and type). It can be controlled by a suitable number of digital bits, e.g. 8 resistance values, controlled by 3 digital bits. The resistor value can be tuned to get acceptable SAW filter source impedance, with reduced additional loss at the output compared to the use of a fixed resistor.

To use this programmable resistor to check the load impedance that is available on the collectors, the output power can be measured for a plurality of different values of the resistor, e.g. 2 different values of resistance. The range of resistor values can be programmed between two extreme values defined by the digital bits. The extra resistor is switched completely on when the digital value has one extreme (e.g. bit value 7) or off when the digital value has the other extreme (e.g. bit value 0). The difference in output power is called "loss". The extra resistor value that is added in parallel to the load impedance is for example 380 Ohms and is called "$R_{extra}$". The following equation can be used to calculate the load impedance at the open collector on chip, in other words, the equivalent matched output impedance.

$$Z_{load} = -R_{extra} + R_{extra} * 10^{Loss/10}$$

$R_{extra}$=extra resistor value that is added in parallel to the load impedance, e.g. 380 Ohms Loss=delta output power between no $R_{extra}$ in parallel (value=0) and $R_{extra}$ in parallel (value=7).

A first embodiment of the invention is illustrated in FIG. 1. This shows a transmitter 20 having an amplifier in the form of a power amplifier PA 30. An output of this amplifier is coupled to a filter such as a SAW filter 40 and an antenna switch, via a matching network 40. The antenna switch enables the circuit to act as a transceiver, coupling the transmitter or a receiver 70 to the antenna. A programmable resistance in the form of a programmable resistance network 35 or similar is also coupled to the output of the amplifier. This programmable resistance is controlled by a controller 60. The controller may be part of the transmitter, or, as shown, external to the transmitter, and either located locally as part of the transmitter, or receiver or transceiver, or remotely. The controller has an input from the output of the amplifier after matching, to determine the output power of the amplifier. A dotted arrow shows that a detector (peak or power detector) can be added on-chip to measure output power as well. It is possible to add that directly at the open-collector output.

Depending on the application, the controller can be arranged to determine the matched output impedance using the equation discussed above. Such operation is shown in more detail in FIG. 2. The results can be used for example for testing, to check the result is within an acceptable range, or for setting the matching correctly during manufacture, or in use. Or this calculation can be carried out elsewhere. The controller may in some cases be used to control the programmable resistance during manufacture only, or during use of the circuit, according to transmission conditions. In some cases, the controller can be used to carry out an automatic test to check the impedance is within acceptable limits, and output a test pass or fail signal.

Figure 2:
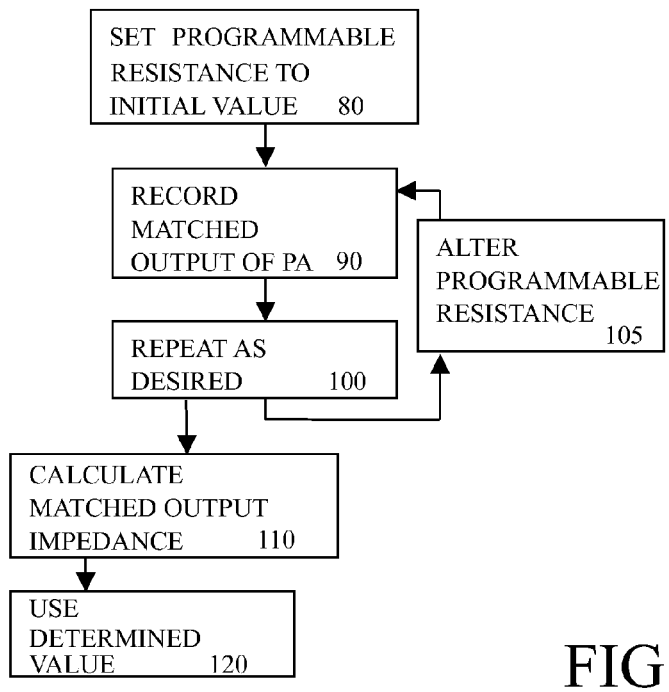
FIG. 2 shows steps of operation of an embodiment.

FIG. 2 shows steps in operation of an embodiment of the invention, making use of the circuit shown in FIG. 1 or other embodiments. At step 80 the programmable impedance is set to an initial value. At step 90, the amplifier output after matching is detected and recorded. The loop is taken at step 100 so that at step 105, the programmable resistance is altered, and step 90 is repeated. Optionally the loop can end and impedance can be calculated at step 110, and the determined value can be used at step 120. If desired, the loop can be repeated for further pairs of values of programmable resistance, and further values of matched output impedance can be calculated, which can be used to form an averaged value of matched output impedance, or a profile of different values.

In other words, a circuit is provided to determine if the equivalent impedance, after matching to an equivalent load such as an on-chip equivalent load, is the correct one. The equivalent impedance is a virtual impedance, e.g. resistance that loads the open collector of the amplifier (or open drain). The equivalent impedance is the combined product of the external load impedance and the matching impedance e.g. provided by a passive matching network such as can be formed by external L, R, C components, as well as other electronic components such as transmission lines, bondwires, leadframes (package) couplings, etc. The effects of the matching impedance, e.g. matching network in most cases is not accurately known. This is especially the case for RF. Notably it is this matching impedance, e.g. matching network that should be adjusted to get the correct equivalent load impedance on chip. To determine how to adjust the matching impedance, e.g. matching network, a known resistance is added directly at the output of the open-collector amplifier. Adding a known resistor or resistor network in parallel with the existing equivalent resistance will give a certain additional attenuation. The resistor can have some capacitance or inductance, as long as it dissipates some power. A pure capacitance will only change the imaginary part (reflect power with a delay). There can be on the chip a programmable C-tune, which can be useful for example to cover 2.3 GHz to 2.7 GHz. An active circuit to simulate a resistor might do, but is more difficult to implement without damage the linearity and power efficiency. This attenuation can be measured externally, by measuring current or voltage or power for example. In other words: a measured attenuation with a known on-chip additional resistor or resistor network, means that the unknown equivalent impedance can be calculated. The unknown resistance is heavily dependent on the matching impedance, e.g. matching network, which can be simulated on a computer But in practice, it is not possible to measure accurately the effects of the package and bond wires and so on, which contribute to the equivalent impedance. A method according to the present invention provides a way to determine the equivalent impedance, based on measurements of the change in output when the additional resistance is varied. This enables the effects of the package and bond wires and so on to be included. The determined values can be used for a variety of purposes, notably for controlling the load on the circuit output (for example the open-collector amplifier) to get the maximum of a given characteristic or optimum trade off between characteristics, such as gain, power or linearity performance.

FIGS. 3-6 Saw Filter Mismatched at Input

A brief discussion of SAW filter matching and what its performance will do when mismatched, now follows as an example of the present invention. A simple test-bench with ideal source and load termination can be used to verify the SAW filter performance in the pass-band (e.g. showing an amount of ripple) and the attenuation just outside the pass-band.

Figure 3:
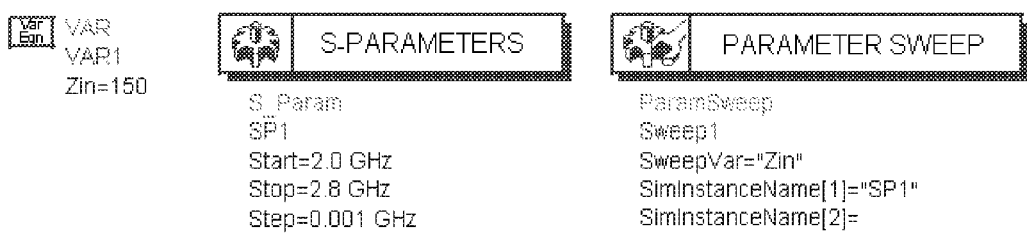
FIG. 3 shows a schematic view of a circuit used for simulating a SAW filter.
Figure 4:
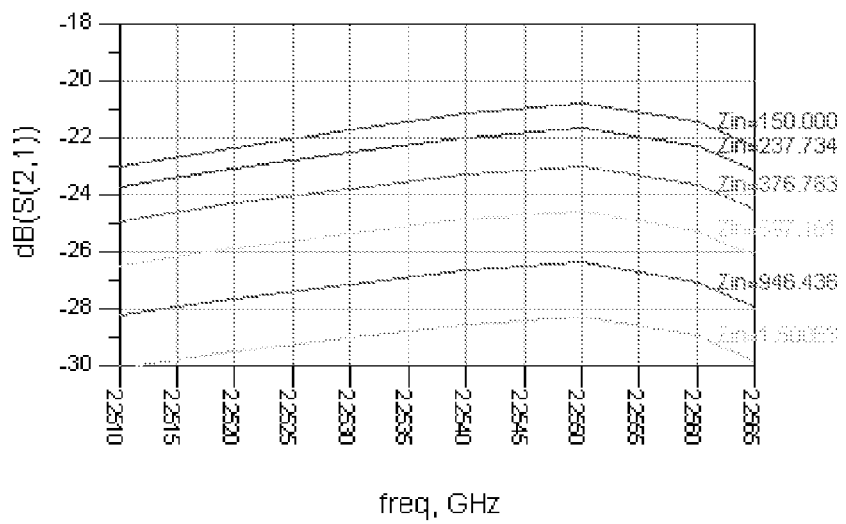
FIGS. 4, 5 and 6 each show filter performance below, in and above pass-band, each for a number of different source impedances.
Figure 5:
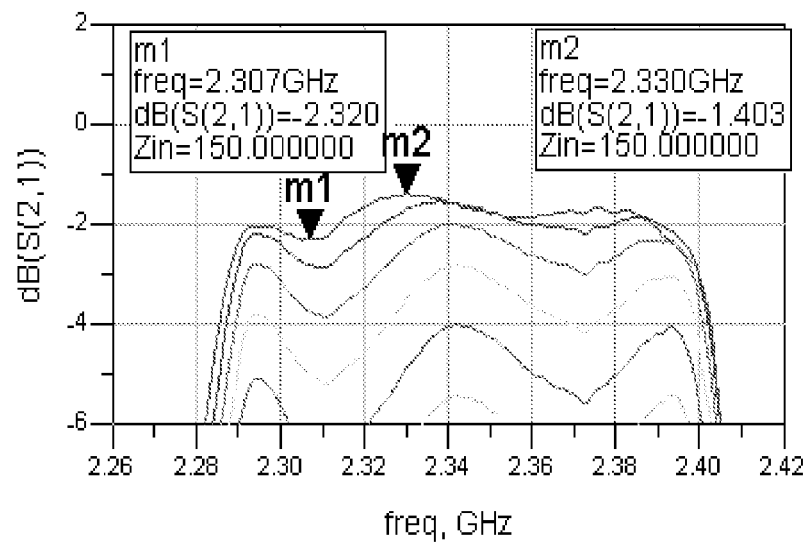
Figure 6:
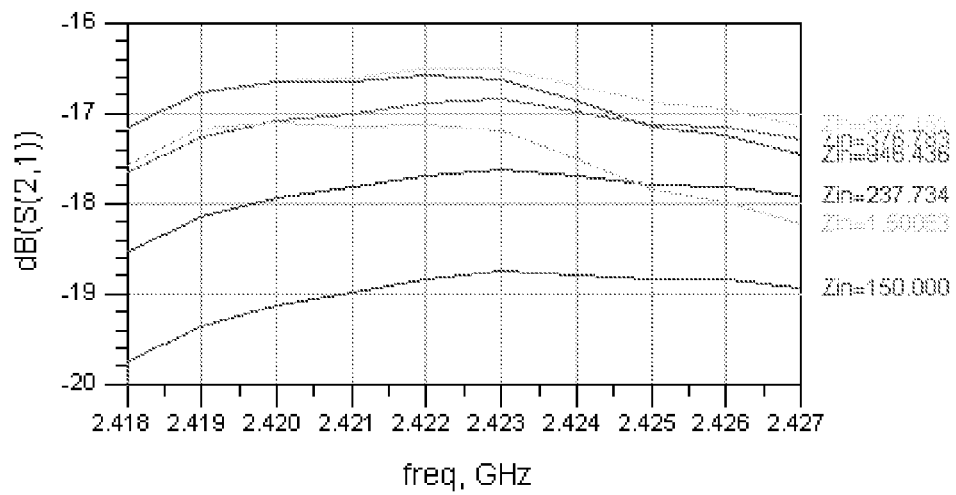

FIG. 3 shows a schematic view of a circuit used for simulating a SAW filter. It shows impedances of driving circuitry on the left side of the SAW, and a load impedance on the right side. The capacitive input at the balanced side is tuned out with a 10 nH inductance with a Q of 40. Results from sweeping a range of frequencies are shown in FIGS. 4, 5 and 6. These graphs each show filter performance near pass-band for different source impedances. FIGS. 4 and 6 show the attenuation just above and just below the pass band, and FIG. 5 shows an amount of ripple in the pass band.

At the low-side the attenuation improves for higher impedances: 8 dB. At the high-side the attenuation gets worse: 2 dB. In the band it is clear that the ripple of 0.9 dB matched drops to more than 2 dB when the source is 1500 Ohms.

Figure 7:
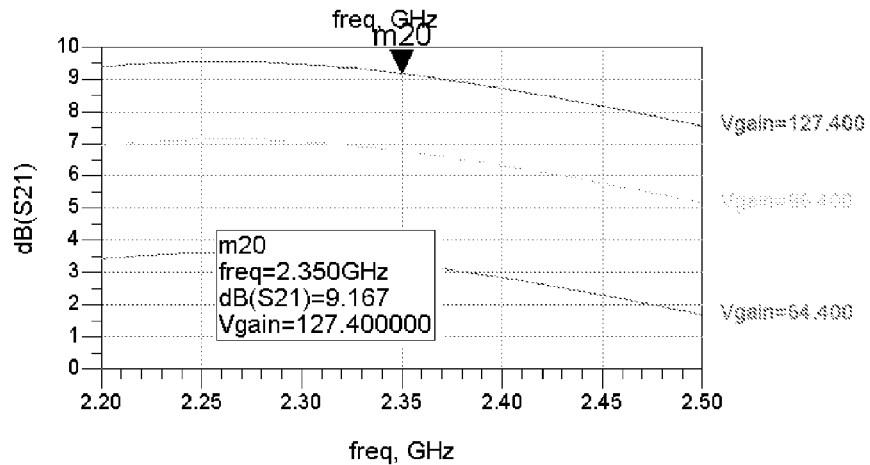
FIGS. 7 and 8, show amplifier output without and with a SAW filter and additional parallel connected resistor.
Figure 8:
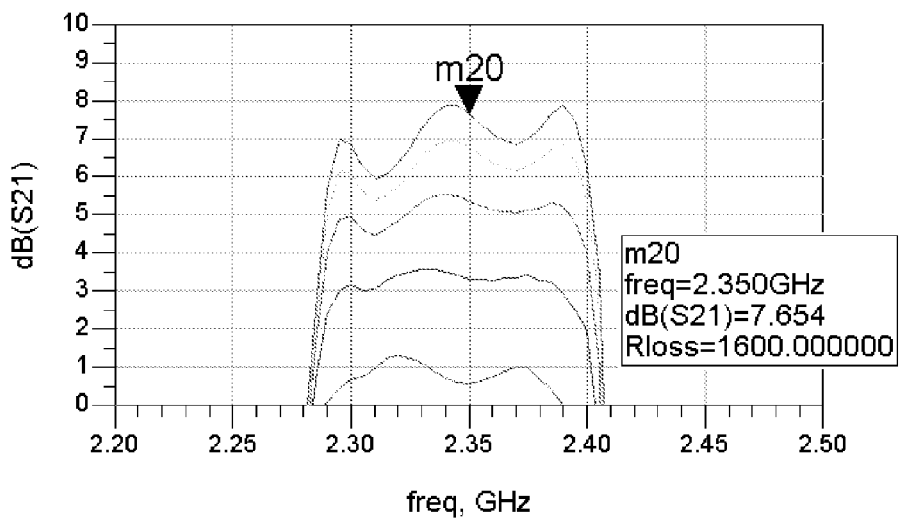

FIGS. 7 and 8: Saw Filter Performance with Amplifier Connected

The S21 is used for this experiment. S21 is a ratio of power delivered to port 1 to the power output at port 2 and corresponds to gain or amplification. First the in-band performance without the SAW filter is determined, and plotted as shown in FIG. 7, swept across a range of frequencies, for three different gains. At maximum gain, the S21 is 9.2 dB.

FIG. 8 shows the output with the SAW filter, and an additional loss resistor, on the output of the amplifier, swept over a range of frequencies for loss at output. This shows the performance for the maximum gain with the additional loss-resistance in parallel with the collector outputs. The following resistor values were tried, and show an in-band ripple as follows:

| | |
|---|---|
| 160 Ohms: | ripple = 0.6 dB |
| 284 Ohms: | ripple = 0.3 dB |
| 506 Ohms: | ripple = 1.0 dB |
| 900 Ohms: | ripple = 1.4 dB |
| 1600 Ohms: | ripple = 1.8 dB |

The lines are shown in FIG. 8 in order, with the lowest resistance line at the bottom and the highest resistance at the top. The line for 284 Ohms shows the lowest ripple, of 0.3 dB. As can be seen from these examples, a good value of termination resistance for the amplifier feeding the SAW filter is important, otherwise the filter performance suffers, as shown by the in-band ripple increasing to about 1.8 dB in FIG. 8.

FIG. 9, Output Load in the Form of a Programmable Resistor Network

The SAW filter only performs with a flat in-band-ripple if terminated with the correct source and load impedance. The impedance seen from the amplifier (RF) should be 150 Ohms+10 nH in the example used. The 10 nH is part of the output matching network. The 150 Ohms is partially made up of the losses in the on-chip coil, finite output impedance of the active stage, etc. However, in a typical circuit implementation, these losses do not come close to the 150 Ohms value, but are typically nearer 1 k Ohm. This output load termination block is an option to improve the SAW filter termination.

FIG. 9a is a simplified schematic of a suitable output load termination in the form of a programmable resistor network. "A" and "B" are the RF nodes connected to a balanced open-collector amplifier. Digital signals SW[0] to SW[2] control the three pairs of switches. In FIG. 9a each of three parallel branches has a pair of switches in series with one resistor in the middle. Each pair is switched by a different one of the digital signals. FIG. 9b has a similar arrangement of three parallel branches, but each has a pair of switches in series with a resistor on each side of the pair of switches. A third implementation (not shown) would be 1 switch in the middle with 2 resistors. The 2 switches with 2 resistors is typically the easier to implement. NMOS transistors can be used as the switches.

The values of the resistors shown in FIGS. 9a and 9b are examples and other values can be used: They could have the values 320, 640 and 1280 ohms for example.

The examples shown have three pairs of transistors, which gives 8 possible combinations of states. Each pair of transistors is in series with a number of series coupled resistances. Each transistor pair switches their respective resistances in or out of a parallel coupling with the amplifier output, in this case an open collector output circuit.

It can be useful in some applications that the resistor network has a low parasitic capacitance to achieve the highest off-state impedance. The transistors can be NMOS, and can be represented as an RF-NMOS model (e.g. for modelling reasons) and again should have a low parasitic capacitance such as fF or lower. There is one 2 pF mim-capacitance for DC-decoupling purposes.

Figure 11:
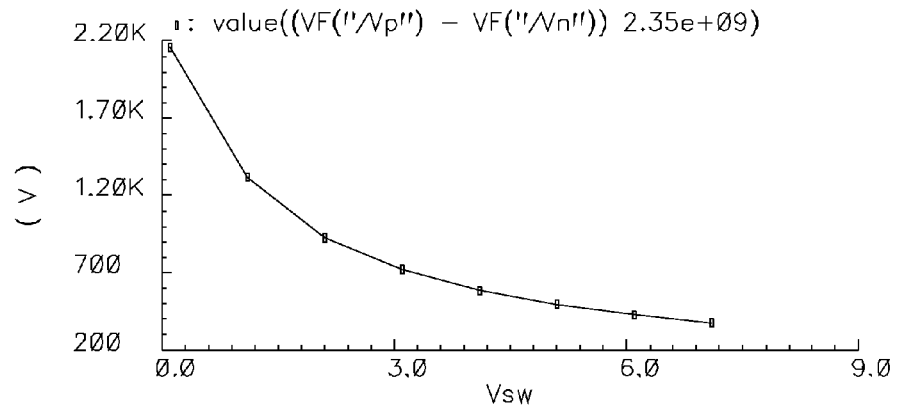

FIGS. 10, 11 Simulation Results

FIGS. 10 and 11 show results of measuring the output load termination. FIG. 10 shows an overall LC-tank resonance for all combinations of the termination. The line having the highest peak represents the highest total termination resistor value. Highest resistance corresponds to all switches are open. Lowest resistance corresponds to when all are closed. That value at 2.35 GHz is plotted in FIG. 11. The highest resistance (off-state) is 2.2 kOhm. The lowest is 380 Ohms. This is not 150 Ohms, however the 150 Ohms is transformed on-chip to 225 Ohms. The bondwires+transmission lines (connections on the PCB) plus external components transform the impedance. So 150 Ohms at SaW is 225 Ohms on chip at open collector.

Some losses are on chip and 380 Ohms in parallel of these losses (mainly the transistor, because the coil used on-chip is already in this simulation) will make it pretty close to 225 Ohms.

FIGS. 12-15 Adding the Output Load to the Amplifier

Figure 12:
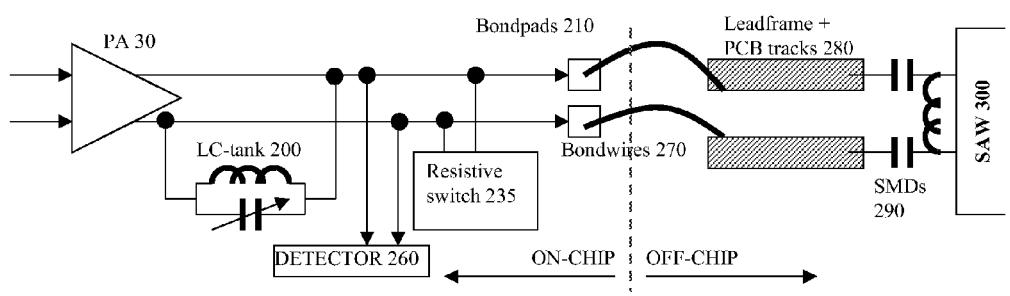
FIG. 12 shows an overall schematic of a transmitter according to an embodiment.

FIG. 12 shows a circuit schematic diagram with an amplifier PA 30 and load termination. The load has been added on the amplifier in the form of a resistive switch 235 (150 Ohms). An LC-tank 200 is shown which is not always necessary. This LC-tank can be tuned by the capacitance to set the resonance of the LC-tank to the correct frequency. This Figure also shows an on-chip detector 260 coupled directly at the open-collector amplifier, for detecting matched output power. The amplifier outputs are fed off chip though bond pads 210, bondwires 270 to an off chip SAW 300, though a leadframe and PCB tracks 280, and terminating capacitors and inductors in the form of SMDs 290 (Surface mount devices). These terminating devices can take many different forms as would be well known, and the illustration is a schematic representation.

The resistive switch, the bondpads, bondwires, leadframe, PCB-tracks and SMD's form the unknown, matching network. The characteristics of this network can be simulated to some level by EM-simulators, however fine tuning is needed in practice, by means of actual measurements.

Figure 13:
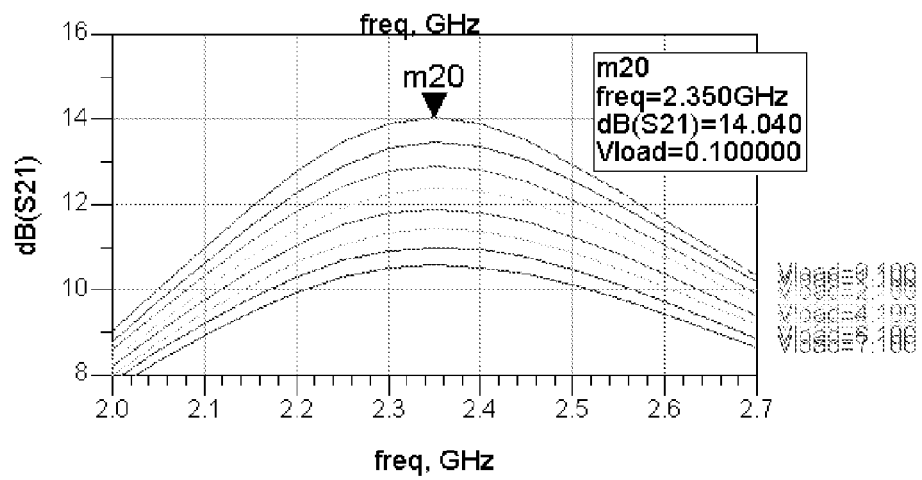
FIG. 13 shows results for S21 over a range of frequencies.
Figure 14:
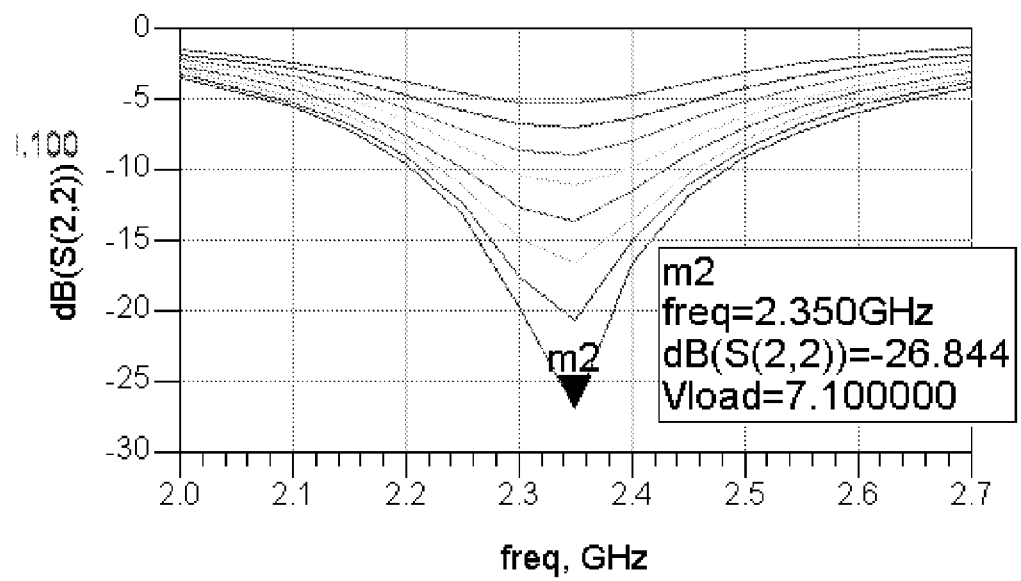
FIG. 14 shows corresponding results for S22.

The results without load showed an S21 of 14.0 dB. Adding this load circuit in the form of the programmable resistor network and sweeping the 3 bits, with small signal simulation of the amplifier (RF-VGA2) with load termination produced results as shown in FIGS. 13 and 14.

The maximum S21 is still 14.0 dB for value 0. The minimum gain is 10.6 dB for value 7. FIG. 13 shows results for S21 over a range of frequencies. The LC-tank creates the nice shape of FIG. 13. FIG. 14 shows corresponding results for S22. S22 is a ratio of power reflected from port 2 compared to power output at port 2. S22 reflects how good the matching is. No reflection means a perfect match.

Using Rload to Determine the Matched Load Impedance

On chip, a circuit can be provided that adds a resistor in parallel of the collector outputs. This resistor can be altered in a number of steps, e.g. 7 steps from one extreme value to another, e.g. infinite to 380 Ohms for nominal process and temperature. The difference between infinite and 380 Ohms can be used to calculate the load impedance on chip. The calculated load also includes the limited Q of the on-chip tank and the losses in the transistor like early effect. Optionally, these losses are regarded as negligible. Measurements have been performed using different values of Rload by switching the programmable resistor network. As explained above, the maths involved is simple: $Z_{load} = R_{load} - R_{load} * 10^{Loss/10}$

TABLE 1

| | F = 2.30 GHz | F = 2.35 GHz | F = 2.40 GHz |
|---|---|---|---|
| Pout, uncorrected, Rload = infinite | 0.93 | 1.01 | 1.11 |
| Pout, uncorrected, Rload = 380Ω | −1.31 | −1.44 | −1.51 |
| Delta Rload | −2.24 | −2.45 | −2.62 |
| Attenuation | 2.24 | 2.45 | 3.4 |
| If Rload is 380 Ohms | 380 | 380 | 380 |
| Calculated load at collector | 256.5 | 288.0 | 451.3 |

Table 1 shows conditions and calculated matched load at the open collector output of the amplifier, for a number of different Wibro (WiMax) channels and bands.

For each band, two columns are shown in the table, one for "infinite" Rload and one for "380 Ohms" Rload. The difference in output power between the two columns is the loss introduced by the "Rload" circuit. The additional resistor eats up a portion of the collector current. The ratio between the additional resistor and the load impedance seen at the collectors gives a certain loss. As the additional resistor is known, we can determine the on-chip additional resistor, and hence calculate the load impedance at the collector.

In practice the values of on-chip resistors are typically not accurate. That resistor can be off by up to 20% due to manufacturing variations. For the −20% case, the load impedance moves from 210 Ohms to 255 Ohms. This is very close to the optimum simulated load. For the 0% case, the load impedance moves from 255 Ohms to 290 Ohms: see above calculation. For the +20% case, the load impedance moves from 300 Ohms to 372 Ohms.

The load impedance is shown to increase by 20% from 2.3 GHz to 2.4 GHz. 255 Ohms is already on the high side. That is good for gain, but bad for linearity. One can derive from these results, that the best match is when the load impedance (Zload) is constant over the whole band.

Concluding Remarks

Above has been described a device and method using a programmable resistance, e.g. a programmable resistance network to determine equivalent matched output impedance values, and thus enable better termination to improve amplifier and/or filter performance. Additional features of some embodiments are the programmable resistance being coupled in parallel to a matching impedance such as a matching network. In principle it could be coupled in series, but typically that would add more loss into the output.

Another such additional feature is the amplifier having an open collector output. This is typical for RF amplifiers, though in principle other arrangements are feasible, though other known arrangements tend to be less power efficient. Another such additional feature is the programmable resistance comprising passive resistances coupled by switches. Another such feature is the programmable resistance being implemented on the same integrated circuit as the amplifier. In principle it could alternatively be off chip, but having it on chip can be more cost effective. Another such feature is the controller being implemented on the same integrated circuit as the amplifier. Another such additional feature is the matching impedance, e.g. the matching network being adjustable, and the controller being arranged to use the determined value of matched output impedance to adjust the matching impedance, e.g. matching network. Another such additional feature is the controller being implemented by a baseband processor. Another such feature is the controller being arranged to control the programmable resistance during manufacture, and to fix the programmable resistance during use of the transmitter at a certain value. Another such additional feature is the controller being arranged to control the programmable resistance during use of the transmitter, according to transmission conditions, i.e. dynamic adjustment and optimization of the resistance during use. Another such additional feature is the controller being arranged to test the transmitter by verifying that a difference in amplifier outputs for different values of the programmable resistance is within a predetermined range. Another such additional feature is a filter such as a SAW filter being coupled to an output of the amplifier. In principle an alternative to having a filter is to have a direct coupling to a transformer or an external power amplifier?

A notable benefit of determining this matched output impedance is that it can facilitate debugging and evaluating circuit boards during development, manufacture, testing, maintenance, field testing and so on. It can be used to enable the matching to be adjusted more accurately, or to suit different requirements or conditions, during manufacture, or during live operation, for example. The circuit can be implemented with a plurality of resistor values, e.g. 7 different resistor values to address the above mentioned SAW filter source impedance issue. To determine if the right match is applied, only 2 values are needed, typically a highest and a lowest, that is: infinity or 380 Ohms in the example. For setting the output impedance to match the SAW any number of values can be used or implemented. Methods and apparatus according to the present invention can solve or reduce problems related to not knowing what the on-chip impedance is at the output stage. It can provide insight to assist in diagnosing a wide variety of problems which can affect the matched output impedance seen on-chip, by determining if it is too high or too low or correct.

The programmable resistive network can be implemented using discrete components or with any type of integration, such as integration with the amplifier or with the filter, or both. It can be in the form of an RF integrated circuit or a SiP (single in line package) for example. The device can be used in a method of testing whether the RF device comprising PA and filter and a loadline coupling both has optimum/correct load impedance and source impedance. It can also be used in a method of automatic testing and subsequent modification of the power level (i.e use as part of a power detector). It can also be used in a method of modification of output power of an RF device comprising PA, filter and a loadline, on the basis of a certain input signal (for instance communication between mobile phone and a basestation).

As has been described above, the matched output impedance can be calculated either on chip or elsewhere, by doing two or more measurements and having a third value available (the extra on-chip resistor that is switched). This can be achieved without soldering, without special boards, without open chips, or special chips, and can be determined almost instantaneously. Even an approximate measurement and calculation can be used to determine if the correct load is applied, and if it is too high or too low, correct it. If more precision is used for the measurement and calculation, then a more accurate value for the matched output impedance can be calculated. In an embodiment, the programmable resistor network can be a 3-bit network providing 8 values (for instance between 380 Ohms and infinity).

Applications

The resistive switch (network) can be implemented at any desired position with an RF front end IC or System-in-Package (SiP):

as part of a single IC (comprising for instance a transceiver, power amplifier and LNA)

as part of a power detection & control IC (a separate IC as used in PA modules)

as part of a power amplifier device as part of a 'platform device' such as PASSI/PICS used in SiP The resistive switch can be used for any one or more of the following purposes:

for onetime testing (i.e. a customer may do the programming in order to select optimum impedance in view of the application (e.g. impedance of PCB and whatever).

for testing whether the device is used in the proper manner (it is required for an LNA that Z*load, amplifier=Z*source, filter, while this is never the case for the PA).

as a feedback; this allows to switch on and off in specific situations, (off in case one desires to supply max power, for instance when distance between mobile phone and base station is large; and on in cases when less power should be supplied).

to enable automatic testing: the onetime test provides information that the circuit has a dB-value A1 when the resistive switch is closed, and another dB-value A2 when it is open. When the difference between A1 and A2 is in a specified range, the filter has a desired flatness, and/or the amplifier has a desired output impedance.

Other variations and applications can be envisaged within the scope of the claims.

The invention claimed is:

1. An R.F. circuit having an amplifier, a matching network coupled to an output of the amplifier, a programmable resistance coupled to the output of the amplifier and configured to receive an output signal generated by the amplifier, and a controller arranged to control the programmable resistance, and to determine a matched output impedance of the amplifier by detecting a change in the amplifier output for different values of the programmable resistance;

wherein the programmable resistor is switched to two or more different values, wherein the matched output impedance is determined by using, $$Z_{load} = -R_{extra} + R_{extra} * 10^{Loss/10}$$

where $R_{extra}$=the difference between the different values of the programmable resistance, and Loss=the difference in output power resulting from the change in the programmable resistance.

2. The circuit of claim 1, wherein the programmable resistance is coupled in parallel to the matching network.

3. The circuit of claim 1, wherein the amplifier has an open collector output.

4. The circuit of claim 1 further comprising a filter coupled to the output of the amplifier.

5. The circuit of claim 4, wherein the filter is a SAW filter.

6. The circuit of claim 1, wherein the programmable resistance is a passive resistance coupled by transistors.

7. The circuit of claim 1, wherein the programmable resistance and the amplifier are implemented on the same integrated circuit.

8. The circuit of claim 1, wherein the controller and the amplifier are implemented on the same integrated circuit.

9. The circuit of claim 1 wherein the matching network is adjustable and wherein the controller uses the determined value of matched output impedance to adjust the matching network.

10. The circuit of claim 1, wherein the controller is implemented by a baseband processor.

11. The circuit of claim 1, wherein the controller controls the programmable resistance during manufacture, and does not alter the programmable resistance during use of the circuit.

12. The circuit of claim 1, further comprising an RF transmitter, wherein the controller is arranged to control the programmable resistance during use of the RF transmitter.

13. The circuit of claim 12, wherein the controller determines that a difference in amplifier outputs for different values of programmable resistance is within a predetermined range.

14. The R.F. circuit of claim 1, wherein the programmable resistor is configured to be switched to two or more different values, wherein the matched output impedance is determined based on the difference between the different values of the programmable resistance and based on the difference in output power resulting from the change in the programmable resistance.

15. A method of operating a circuit having an amplifier, a matching network coupled to an output of the amplifier, and a programmable resistance coupled to the output of the amplifier, the method comprising the steps of controlling the programmable resistance, and determining a matched output impedance of the amplifier by detecting a change in the amplifier output for different values of the programmable resistance;

further comprising the step of switching the programmable resistor to two or more different values, wherein the matched output impedance is determined by using, $$Z_{load} = -R_{extra} + R_{extra} * 10^{Loss/10}$$

where $R_{extra}$=the difference between the different values of the programmable resistance, and Loss=the difference in output power resulting from the change in the programmable resistance.

16. The method claim 15, further comprising the step of adjusting the matching network by using the determined value of matched output impedance.

17. The method of claim 15, wherein the controlling step occurs during manufacture.

18. The method of claim 15, wherein the controlling step occurs during use of the transmitter.

* * * * *